United States Patent
Brittain et al.

(10) Patent No.: US 7,426,649 B2
(45) Date of Patent: Sep. 16, 2008

(54) POWER MANAGEMENT VIA DIMM READ OPERATION LIMITER

(75) Inventors: Mark Andrew Brittain, Pflugerville, TX (US); Warren Edward Maule, Cedar Park, TX (US)

(73) Assignee: International Business Machines Corporation, Armonk, NY (US)

( * ) Notice: Subject to any disclaimer, the term of this patent is extended or adjusted under 35 U.S.C. 154(b) by 324 days.

(21) Appl. No.: 11/054,374

(22) Filed: Feb. 9, 2005

(65) Prior Publication Data
US 2006/0179333 A1    Aug. 10, 2006

(51) Int. Cl.
    *G06F 1/26* (2006.01)
(52) U.S. Cl. .............. 713/320; 713/300; 713/323; 713/340; 711/100; 711/105; 711/154
(58) Field of Classification Search ............. 713/320, 713/300, 323, 340; 711/100, 105, 154
    See application file for complete search history.

(56) References Cited

U.S. PATENT DOCUMENTS

| | | | |
|---|---|---|---|
| 7,064,994 B1 * | 6/2006 | Wu | 365/211 |
| 2002/0041507 A1 * | 4/2002 | Woo et al. | 365/51 |
| 2003/0093614 A1 * | 5/2003 | Kohn et al. | 711/105 |
| 2003/0229821 A1 * | 12/2003 | Ma | 714/8 |
| 2004/0260957 A1 * | 12/2004 | Jeddeloh et al. | 713/300 |
| 2005/0289292 A1 * | 12/2005 | Morrow et al. | 711/105 |

* cited by examiner

*Primary Examiner*—Chun Cao
(74) *Attorney, Agent, or Firm*—Diana R. Gerhardt; Dillon & Yudell LLP

(57) ABSTRACT

A method and system for enabling directed temperature/power management at the DIMM-level and/or DRAM-level utilizing intelligent scheduling of memory access operations received at the memory controller. Hot spots within the memory subsystem, caused by operating the DIMMs/DRAMs above predetermined/preset threshold power/temperature values for operating a DIMM and/or a DRAM, are avoided/controlled by logic within the memory controller. The memory controller logic throttles the number/frequency at which commands (read/write operations) are issued to the specific DIMM/DRAM based on stored parameter values and tracking of outstanding operations issued to the memory subsystem devices.

6 Claims, 7 Drawing Sheets

POWER MANAGEMENT VIA DIMM READ OPERATION LIMITER

CROSS REFERENCE TO RELATED APPLICATION(S)

The present invention is related to the following commonly assigned, co-pending applications: "Streaming Reads in a Cascaded Memory Subsystem With Buffered Memory Modules," Ser. No. 11/054,446, and "Dynamic Power Management Via DIMM Read Operation Limiter," Ser. No. 11/054,392, each filed concurrently herewith. The contents of the above applications arc incorporated herein by reference.

BACKGROUND OF THE INVENTION

1. Technical Field

The present invention relates generally to computer devices and in particular to operating parameters of memory subsystems. Still more particularly, the present invention relates to a method and system that provides direct management of power usage by memory modules within a memory subsystem.

2. Description of Related Art

Increases in processor performance and the proliferation/development of multi-core, multi-threaded processor dies have led to a rapidly increasing need for more memory bandwidth and capacity. While processor development is on a high performance growth path, developments in memory components (e.g., dynamic inline memory modules (DIMMs)) are growing at a much slower rate with respect to both density and performance of their dynamic random access memory (DRAMs).

To keep up with the increasing demands for required data bandwidth and capacity, memory subsystems have had to increase both their frequency of operation and the density of the DIMMs. In addition, due to physical constraints of the overall computer systems, the volume of space that is allocated to the DRAMs on the memory modules has not increased much over time. The combination of increasing need and constant (if not shrinking) space has resulted in packing more DRAMs on each DIMM and more DIMMs into the same physical space. The resulting increased density results in an increase of the power dissipation per DIMM, while the space limitations have reduce the airflow and cooling capacity at the chip level.

In a conventional memory subsystem, power is consumed by a number of components. The main sources of power consumption are the DRAMs and the control chips on the DIMMs. To a lesser degree, power is consumed by discreet devices that are used to terminate the electrical signaling between the memory controller and the DRAMS. However, there is little that can be done to reduce this power consumption.

A DRAM consumes different amounts of power depending on the current state of the DRAM's logic. In general, there are three distinct power states that are relevant. The lowest power state is a "power down" state, at which a typical DRAM may consume less them 10 mwatts of power. The next power state is the "standby" state, at which the typical power consumed is close to 70 mwatts. Finally, the highest power state is the "operating" state, at which power consumption may range between 100 and 700 mwatts.

Within a given memory subsystem, the individual DRAMs may be in any one of the three power states at any time based primarily on the memory access patterns and the bandwidth requirements of the system. While these power consumption values may appear small, a large server system may have tens of thousands of DRAM chips installed. With potentially thousands of DRAMs packed into a relatively small space and each consuming some amounts of power, the possibility of the memory chips overheating becomes a major design concern.

Power management is provided by most conventional systems with system-level temperature control via feedback cooling systems and/or system-level voltage/current control. Cooling systems are designed to attempt to offset/reduce the overheating of the memory subsystem as a whole. Designing cooling systems to provide sufficient cooling capacity for these high density memory systems is extremely difficult as the cooling systems have to keep up with the increasing density of these memory chips. Occasionally, during operation, several DRAMs in close vicinity to each other may be continually in the operating state (as operations targeting the DRAMs are issued), leading to the creation of a hot spot (i.e., localized overheating) within the memory subsystem.

FIG. 1 illustrates a block diagram representation of one prior art power management method having both system level temperature control and voltage/current controls. The temperature control utilizes a feed back control loop and system fans. The computer system includes a processor 111 connected to memory devices 106 via a memory controller 101. Memory devices generally refer to DIMMs on which DRAMs or SRAMS, etc., are built. Located in vicinity of the memory devices is a temperature (voltage) sensor 108 that records and transmits the current temperature (voltage) surrounding the memory devices 106. Also located near to the memory devices 106 is a fan 112, which receives variable current from a fan speed controller 114 and turns on at a corresponding speed to cool the memory devices when the temperature goes above a preset level.

Two control loops are established, with the first being the temperature sensor 108 coupled to the fan speed controller 114, which is in turn coupled to the fan 112. The second control loop includes the processor 111, which includes a memory access command throttling function 113 that responds to the power usage of the memory subsystem reaching or surpassing a preset power usage threshold value by throttling the amount of memory access commands that are sent to the memory controller 101.

While the above described power management/control techniques provide general cooling and maintenance of maximum power usage for the memory subsystem, there is currently no way of predicting where hot spots will occur within the different memory modules. Thus, the above described power management mechanisms are not always able to adequately provide limits on power usage or sufficient cooling directed at these potential hot spots, rather then general power management directed at the entire memory subsystem.

Since these hot spots could eventually lead to burn-out or failure of the DRAMs and/or DIMMs, the present invention recognizes that it would be desirable to be able to provide some directed power management that could more effectively prevent the occurrence of localized hot spots caused by operation of specific DRAMS or specific DIMMs. The invention further addresses the limitations of reliance on system-level power management and response techniques by providing techniques for managing power at the DIMM and DRAM levels. Also, the invention enables directed responses to localized dissipation of heat that targets the particular DIMM or DRAM at which the problem is occurring.

SUMMARY OF THE INVENTION

Disclosed is a method and system for enabling directed temperature/power management at the DIMM-level and/or DRAM-level utilizing intelligent scheduling of memory access operations received at the memory controller. The invention manages power usage by lower-level memory devices and prevents overheating (hot spots) at the individual DIMM and/or DRAM levels, while enabling efficient distribution of the memory access commands to the various DIMMs in a multi-DIMM memory subsystem to enable maximum use of the available memory channel bandwidth and DIMM data bus bandwidth.

Hot spots within the memory subsystem, caused by operating the DIMMs/DRAMs above predetermined/preset threshold power/temperature values, are avoided/controlled by logic within the memory controller. The memory controller logic throttles the number/frequency at which commands (read/write operations) are issued to the specific DIMM/DRAM based on the specific DIMM/DRAM reaching the preset threshold power/temperature value. A static power management/control model and a dynamic power management/control model are provided.

In the static power management/control model, the power usage parameters (e.g., amount of maximum dissipated power (current/voltage)) allowed during maximum operational state, power consumed at each of the three possible states of the DRAMs) of each DIMM and DRAM is stored within the memory controller. Using these parameters and tracking the operations directed at the specific DIMMs/DRAMs, the memory controller logic issues an amount of processing load to each individual DIMM/DRAM, calculated to prevent the individual DIMMs/DRAMs from consuming more than their respective maximum amount of allowed power at any given time.

The preset amount of power is a threshold value below which the cooling capacity of the system is designed to handle and hot spots are substantially eliminated. When the controller logic determines that a DIMM/DRAM has been issued enough processing load to reach/approach this threshold value, the memory controller withholds issuing additional read/writes targeting the particular DIMM/DRAM. The memory controller skips these reads/writes and issues other reads/writes targeting other DIMMs that have not yet reached their threshold value. DIMM-specific and/or DRAM-specific throttling of memory access commands are thus completed by the memory controller, rather than a general system throttling provided by the power management techniques in conventional systems.

In addition, since power and thermal variations in a system are not instantaneous, the memory controller can be programmed to track the average power utilization over a programmable window of time rather than an instantaneous power value. This allows the access pattern to briefly exceed the limit set by the system in the power management logic but, on a broader average, the power utilization will stay under the limit. System performance is also improved by reducing the number of times that operations are throttled in the system.

In the dynamic power management/control model, current power usage (voltage levels and/or temperature/heat dissipation) values are tracked via a series of power usage sensors placed proximate to or on the DIMMs/DRAMs themselves. These power usage sensors are connected to the memory controller logic and feed the controller logic with current, location-specific power usage values. With these power usage values received, the memory controller logic dynamically determines which DIMM or DRAM is actually at or approaching the threshold and automatically throttles/withholds issuance of reads/writes targeting that particular DIMM/DRAM.

In one embodiment, the dynamic feedback mechanism is utilized in the calculation performed by the static method to dynamically update the stored static parameters for each operating device. Also, in one embodiment, a complete power management/control system is provided by adding the DIMM-level and DRAM-level power management/control techniques to a system that also implements the conventional techniques involving temperature feedback for cooling the entire memory subsystem and throttling of processor-level processes to control the overall power usage of the memory subsystem.

The dynamic feedback allows the system to adjust its throttling mechanism based on actual power requirements of the installed set of DIMMs. This dynamic adjustment is important since DRAMs from different suppliers have different power profiles and because physical environments may vary, allowing for more or less cooling capabilities in the system.

Four different power usage functions are provided within both the static and dynamic implementations. These are designed to yield the improved efficiencies in power management, while increasing utilization of overall data bus bandwidth (i.e., use of the data memory devices and the memory channel) at the memory subsystem. The first three functions are introduced above and include: (1) management of the total memory subsystem power; (2) management of the individual DIMM power; and (3) management of the individual DRAM power. In addition to these functions, a fourth function is identified by the invention, namely, (4) management of the address space to the DIMMs.

According to this fourth function, the distribution of power across the DIMMs in the system is maintained by dividing the address space across all the individual DIMMs within the system. Thus, rather than provide sequential groupings of consecutive addresses in each individual DIMM, each sequence of addressed is shared across multiple DIMMs so that access to a sequence of addresses hit multiple DIMMs in sequence rather than a single DIMM. This configuration of the address space also allows DIMMs to be busy less frequently when a next access operation is received since the next operation does not target the same DIMM as the previous memory access operation.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF ILLUSTRATIVE EMBODIMENTS

The present invention provides a method and system for enabling directed temperature/power management at the DIMM-level and/or DRAM-level utilizing intelligent scheduling of memory access operations received at the memory controller. The invention manages power usage by lower-level memory devices and prevents overheating (hot spots) at the individual DIMM and/or DRAM levels, while enabling efficient distribution of the memory access commands to the various DIMMs in a multi-DIMM memory subsystem to enable maximum use of the available system data bus bandwidth and DIMM data bus bandwidth.

Hot spots within the memory subsystem, caused by operating the DIMMs/DRAMs above predetermined/preset threshold power/temperature, are avoided/controlled by logic within the memory controller. The memory controller logic throttles the number/frequency at which commands (read/write operations) are issued to the specific DIMM/DRAM based on the specific DIMM/DRAM reaching the preset threshold power/temperature value. A static power management/control model and a dynamic power management/control model are provided.

Static Power Management/Control Model

In the static power management/control model, the power usage parameters (e.g., amount of maximum dissipated power (current/voltage) allowed during maximum operational state, power consumed at each of the three possible states of the DRAMs) of each DIMM and DRAM is stored within the memory controller. Using these parameters and tracking the operations directed at the specific DIMMs/DRAMs, the memory controller logic issues an amount of processing load to the each individual DIMM/DRAM, calculated to prevent the individual DIMMs/DRAMs from consuming more than their respective maximum amount of allowed power at any given time.

Figure 1:
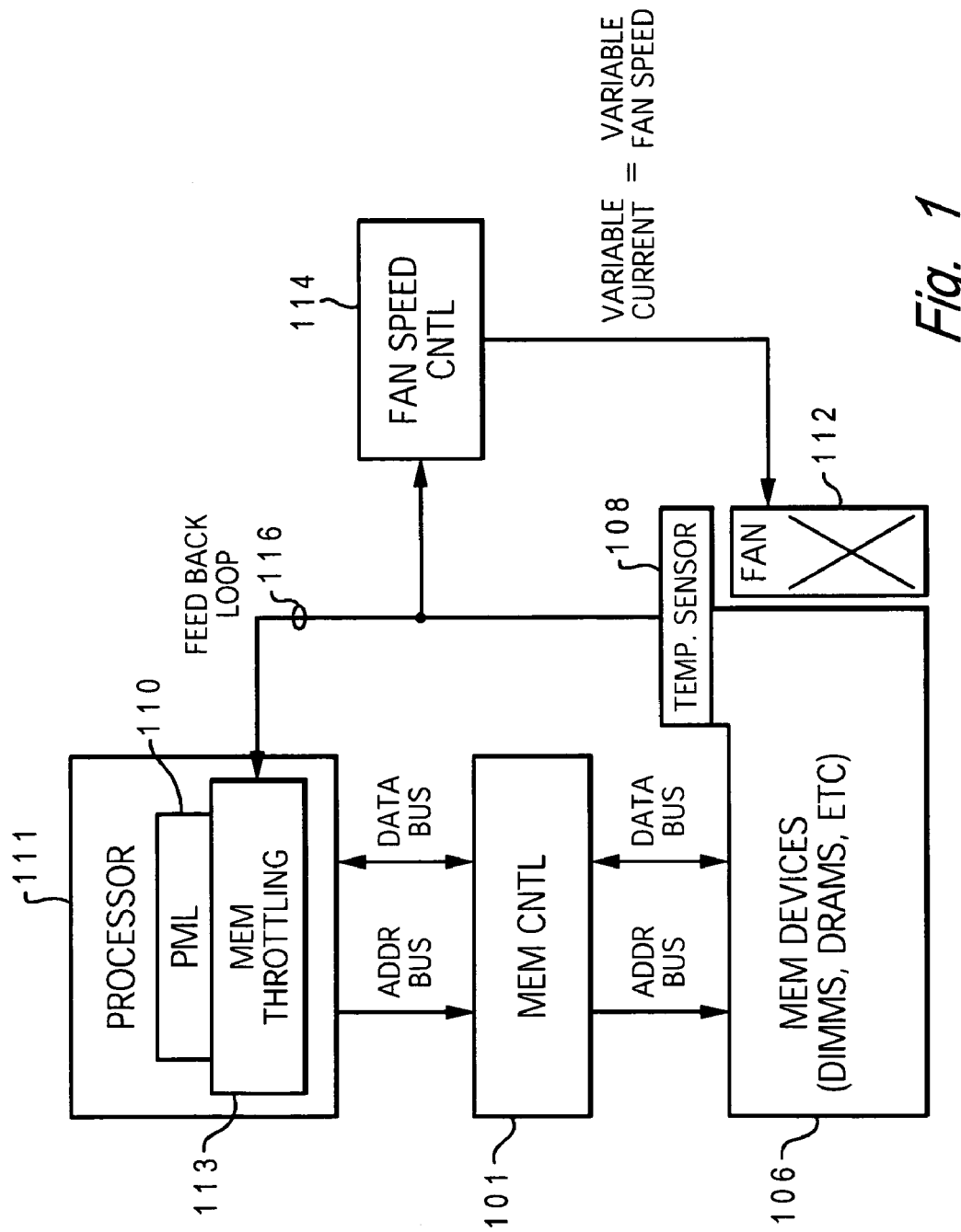
FIG. 1 depicts a prior art power management/control circuit of a memory subsystem within a data processing system.
Figure 2:
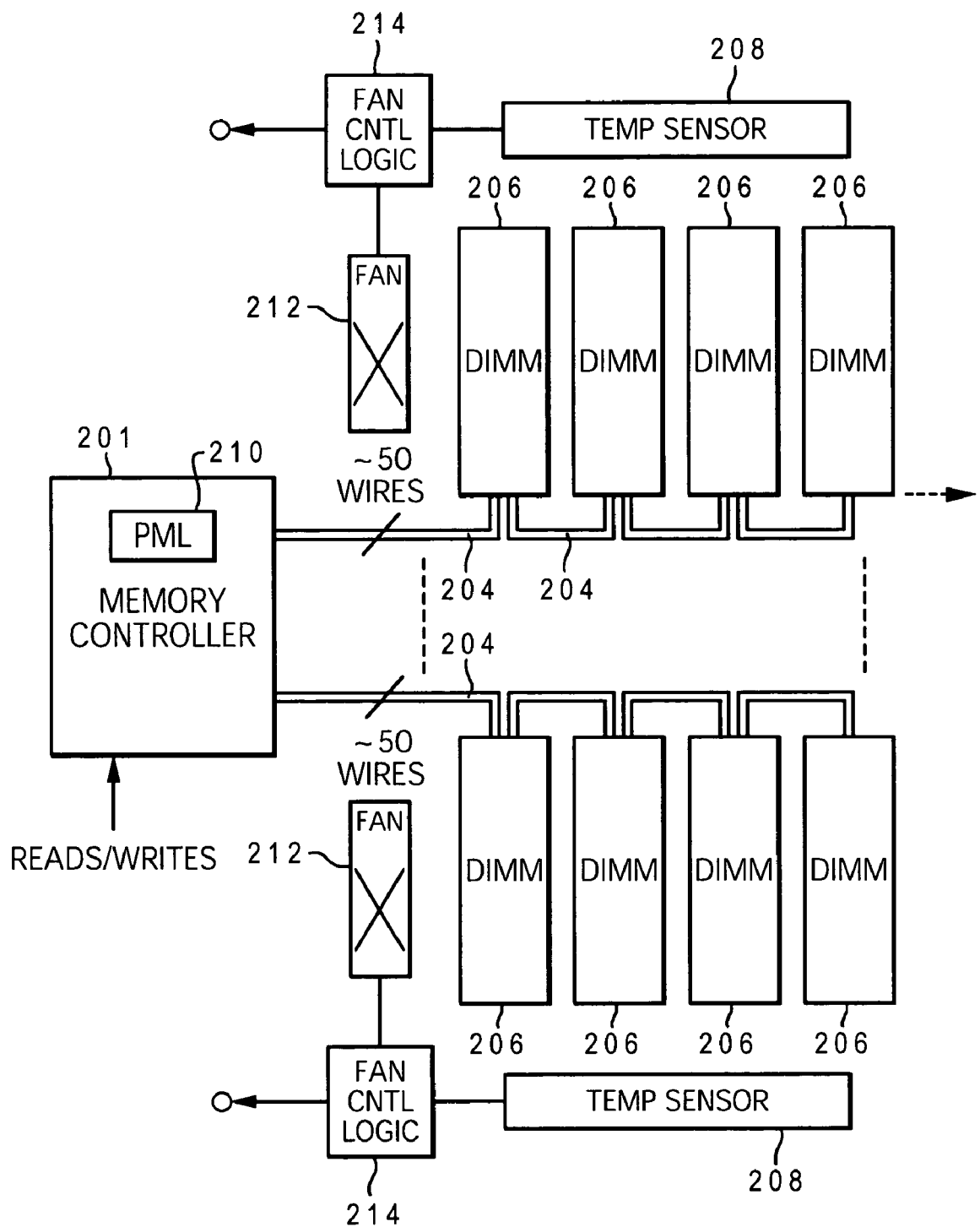
FIG. 2 depicts a cascaded memory subsystem with multiple DIMMs connected via a point-to-point bus configuration within which static system-level power management directed by the memory controller is provided according to one embodiment of the present invention.

FIG. 2 depicts an exemplary configuration of a memory subsystem designed to provide static power management/control. FIG. 2 depicts memory subsystem with cascaded, buffered memory modules and unidirectional busses that are utilized by exemplary embodiments of the present invention. This memory structure includes a memory controller 201 in communication with one or more memory modules 206 via a high speed point-to-point bus 204. One of the functions provided by the memory modules 206 in the cascade structure is a re-drive function to send signals on the memory bus to other memory modules 206 or to the memory controller 201.

Each bus 204 in the exemplary embodiment depicted in FIG. 2 includes approximately fifty high speed wires for the transfer of address, command, data and clocks. By using point-to-point busses as described in the aforementioned prior art, it is possible to optimize the bus design to permit significantly increased data rates, as well as to reduce the bus pincount by transferring data over multiple cycles. An exemplary embodiment of the present invention, as depicted in FIG. 2, provides a four to one bus speed ratio to maximize bus efficiency and to minimize pincount.

Illustrated within the memory controller is power management logic (PML) 210 utilized to track and control the amount of power usage within the memory subsystem as well as at each DIMM and/or DRAM. PML 210 maintains the power usage parameters for the memory subsystem and for each DIMM and DRAM. Additionally, PML calculates new values for current power usage within the various devices as new commands are issued and/or previously issued operations are completed.

Notably, while PML 210 provides the power management features of the static model of the invention, temperature feedback control is still utilized to control the fans 212 coupled to fan control logic 214, which are in turn coupled to a temperature/power usage sensor 208 that tracks power usage at the system-level and responds by varying the speed of the fans 212. Power management within the static model is thus independent of the standard feedback loops, but achieves relatively efficient results in increasing bus utilization while reducing the likelihood of hot spots due to excess power usage at a particular device.

In the general implementation (i.e., memory subsystem-level power management), PML 210 tracks the overall usage of power at the memory subsystem and throttles issuing of additional commands from the memory controller to the memory subsystem when the overall power being consumed by the memory modules approaches a maximum threshold. The maximum threshold is pre-programmed into the power management logic based on the number of DIMMs within the system, the combination of the power ratings for each of the DIMMs, along with other factors (operating parameters) associated with the memory subsystem, etc. The power management logic tracks the power usage as each operation is added to the memory subsystem or completed (i.e., DIMMS not in busy state and data returned or stored).

In a more specific implementation (i.e., the DIMM-level or DRAM-level power management), PML 210 continues to track the overall power usage, but also tracks the power usage for each individual DIMM and DRAM. Throttling of commands is provided for specific DIMMs and/or DRAMs while other DIMMs/DRAMs continued to be issued new read/write commands.

With a further refinement, the PML can track the average power on a DIMM/DRAM basis over a programmable amount of time versus the instantaneous measurements. This will allow a temporary burst of activity that would on an instantaneous basis be outside the programmed power range for the DIMMs. If sustained over a long period of time, the additional activity would cause a thermal problem on the DIMM but over a short burst the additional activity will not significantly change the temperature of the DRAMs on the DIMM. Also, this averaging of power usage over a period of time allows for increased efficiency of the memory subsystem by reducing the number of times that the throttling mechanism would be activated. Additionally, the averaging function allows the static mode of throttling to more closely match the dynamic mode of operation (described below) without the additional cost of the thermal monitors on the DIMMS or DRAMs.

With the present invention, the preset amount of power that is allowed to be utilized by the memory modules in total and individually are a series of threshold values below which the cooling capacity of the system (or devices) is designed to handle and hot spots are substantially eliminated. When the controller logic determines that a DIMM/DRAM has been issued enough processing load to reach/approach this threshold value, the memory controller withholds issuing additional read/writes targeting the particular DIMM/DRAM. The memory controller skips these reads/writes and issues other reads/writes targeting other DIMMs that have not yet reached their threshold value. DIMM-specific and/or DRAM-specific throttling of memory access commands are thus completed by the memory controller, rather than a general system throttling provided by the power management techniques in conventional systems.

Managing power by performing the throttling of commands at the memory controller offers more direct control and faster response to power issues that arise at the memory subsystem overall. This memory subsystem-level solution offers a better solution to the prior art in which the designer of the overall system places a maximum cap on the power usage allocated to the memory subsystem. Using this maximum cap, the memory controller was prevented from sending further access requests to the memory subsystem to maintain the overall power usage of the entire memory subsystem below the maximum level. However, this prior art method does not account for isolated hot spots as DIMMs and DRAMs exceed their power ratings. With the DIMM/DRAM level power management, the memory controller can manage hot spots in the memory subsystem while still allowing maximum accesses to the remainder of the memory modules.

Dynamic Power Management/Control Model

In the dynamic power management/control model, current power usage (voltage levels and/or temperature/heat dissipation) values are tracked via a series of power usage sensors placed proximate to or on the DIMMs/DRAMs themselves. Outputs from these power usage sensors are connected to the memory controller logic and feed the controller logic with current, location-specific operating conditions. With the power usage values received, the memory controller logic dynamically determines which DIMM or DRAM is actually at or approaching the threshold and automatically throttles/withholds issuance of reads/writes targeting that particular DIMM/DRAM.

Notably, as indicated in greater details in FIG. 3A-3B, 4, and 5, within the dynamic model, power usage sensors are placed at various locations within the memory subsystem and feed current operating conditions back to the PML. The PML receives and processes the data about the current operating conditions and directs the select logic to withhold issuing specific ones of the queued read or write operations that target any area (device) that is at maximum power usage (or at a preset threshold maximum power usage).

In one embodiment, the dynamic feedback mechanism is utilized in the calculation performed by the static method to dynamically update the stored static parameters for each operating device. Also, in one embodiment, a complete power management/control system is provided by adding the DIMM-level and DRAM-level power management/control techniques to a system that also implements the conventional techniques involving temperature feedback for cooling the entire memory subsystem and throttling of processor-level processes to control the overall power usage of the memory subsystem.

Notably, the location-specific operating conditions may be different from the calculated operating conditions of the static method due to uncontrollable variances in device designs, failures of specific devices, external conditions, etc. Also, each memory subsystem may include heterogenous DIMMs and/or DRAMs each having different sizes and other cooling capacities, etc. To manage the thermal problems in these different-size systems, the memory controller is designed with power management logic (hardware and/or software logic) that completes one or more of the above four distinct functions, which are performed to maintain the maximum possible bandwidth for any given system design (i.e., adaptable to different sizes of DIMMs and different numbers of DRAMs).

The cooling capability within a system varies based on the type of DIMMs that are installed and the location of the DIMM within the system. Memory DIMMs are generally available with 9 or 18 DRAMS installed thereon (i.e., 9 drams on each side of a DIMM). For larger capacity systems, however, it is possible to stack the DRAMs on each side of the DIMM to increase the capacity to 36 or even 72 drams per DIMM (indicated as dots leading to N DRAMs). These different DIMM capacities affect the power consumption of the DIMMs since each DRAM will have a base (power down) power even if the DRAM is not being accessed. Generally the cooling capability of the system will be less for the larger DIMMs as airflow is reduced between the DIMMS in the system due to their larger size.

Power Management Methods/Techniques

Four different power usage functions are provided within both the static and dynamic implementations. These are designed to yield the improved efficiencies in power management, while increasing utilization of overall data bus bandwidth (i.e., use of the memory devices and system data buses) at the memory subsystem. The first three functions are introduced above and include: (1) management of the total memory subsystem power; (2) management of the individual DIMM power; and (3) management of the individual DRAM power. In addition to these functions, a fourth function is identified by the invention, namely, (4) management of the address space to the DIMMs. Each of these are functions are described in greater details in delineated sections below.

(1) Management of the Total Memory System Power

In one embodiment, the memory controller monitors the total power consumption of the memory subsystem to ensure that the maximum allowable power consumption of the memory-subsystem level is not exceeded. To manage the power consumption at the memory subsystem level, the memory controller tracks the number of outstanding transactions that are active across the full set of DIMMs. Based on the number and the corresponding state of the various devices, the total power consumption is calculated and the issuance of new transactions adjusted accordingly. This total power consumption depends on the number of DIMMS, the size of the DIMMs, and the power and thermal capacity of the memory subsystem, etc. The features of this embodiment manage the overall power and thermal capacity of the memory subsystem but does not control or manage the actual power at a DIMM level.

(2) Management of the Individual DIMM Power

The above solution manages/controls the total power consumed by the memory subsystem so that it is maintained at below the threshold cooling and power supply limits of the entire memory subsystem. However, another embodiment of the invention recognizes the limitations of merely providing a system-level management/control. Similarly to the above described limitations of throttling at the processor, throttling at the memory controller does not address specific problems of managing the power at an individual DIMM level so that each DIMM stays within the cooling capacity of the individual DIMM slot location within the memory subsystem.

Since hot spots can occur on specific DIMMs, for the above system-level throttling to be effective, all operations must be throttled in a manner to guarantee that a single DIMM does not exceed its maximum power/thermal properties. This throttling affects the performance of the memory subsystem by limiting the number of active operations to a level needed to control power on a single DIMM when a higher level of activity would be allowed if distributed across multiple DIMMS. Thus, reducing the traffic/processing load directed to the entire memory subsystem may solve the overall problems but also severely reduces the utilization of data bus bandwidth within the memory subsystem.

The embodiment stems from a recognition that, in order to reduce (or substantially eliminate) the potential for hot spots forming at the DIMM-level within the memory subsystem, throttling should be applied at the DIMM-level itself rather than at the general processor-system-level. That is, the invention directly addresses overloads experienced in particular DIMMs by reducing/limiting the amount of processing occurring at the particular DIMM, thereby reducing the power dissipation at the particular DIMM.

General descriptions of the methods by which memory controller issues reads to the downstream DIMMs, schedules the return of read data on the system data bus to avoid collisions, schedules the issuing and completion of write operations at the DIMMs are provided in co-pending patent applications AUS920041028US1 and AUS920041030US1, relevant content of which are incorporated herein by reference. Of significance to the present invention is the description in these references of the streaming of reads on consecutive command cycles to allow early completion of reads and maximize utilization of both the system data bus (for returning data) as well the on-module data buses. Additionally important is the determination of when to complete writes in the background while reads are being completed at other DIMMs.

While streaming of reads and background processing of writes, etc., provide performance benefits to the overall utilization of the various data buses and the DIMMs in general, the present invention recognizes the possibility of individual DIMMs to be continuously targeted by these streams of reads and buffering of read and write data and thus cause one of more of the DIMMs to potentially overheat. Thus, the invention extends the decision making process of the memory controller in determining which DIMMs are idle to include a determination of which DIMMs are not only idle but operating within the preset maximum/threshold power usage parameter. Recognizing this characteristic of the DIMMs allows the memory controller to throttle the issuing of new commands to particular DIMMs that would otherwise be listed as idle although operating above the threshold for operating temperatures.

With the ability to stream reads to DIMMs on each command cycle and buffer return data (per the above referenced co-pending patent applications), etc., increased efficiency in the use of memory bandwidth is an important goal of the memory subsystem, and this goal is subverted if access to the entire memory subsystem is throttled because of an isolated overheating at a particular DIMM.

Thus, the second embodiment of the invention manages the power usage at each DIMM level by controlling the number and type of accesses to each individual DIMM. This DIMM-level power management feature manages each DIMM individually to guarantee that the power of each individual DIMM does not exceed the thermal cooling capability of the system slot where that DIMM is located.

Accordingly, the described embodiments of the invention responds to localized overheating conditions by reducing loads at the specific DIMMs (i.e., reducing the load (amount of new operations) targeting the specific DIMM, while continuing to feed the other available DIMMs in the cascade with operations at each command cycle. The overall effect is a reduction of processing at the particular DIMM without significantly reducing the overall performance (i.e., use of available bus bandwidth) of the memory subsystem.

With the above described static power management model, the operating parameters (e.g., amount of dissipated power per operational state) of each DIMM is stored within the memory controller, which issues only a pre-calculated amount of processing load to the each individual DIMM. The amount of processing load for each DIMM is one which is calculated to prevent each individual DIMM from consuming more than a preset amount of power at any given time. The preset amount of power is a threshold value below which the cooling capacity of the system is designed to handle. When the controller logic determines that a DIMM has been issued enough processing load to reach/approach this threshold value, the memory controller withholds issuing additional read/writes targeting the particular DIMM. The memory controller skips these reads/writes and issues other reads/writes targeting other DIMMs that have not yet reached their threshold value. DIMM-specific throttling of memory access commands are thus completed by the memory controller, rather than a general memory subsystem throttling.

In the dynamic power management model, a series of power usage sensors are placed proximate to or on the DIMMs themselves. These power usage sensors are connected to the memory controller logic and feed the controller logic with current, location-specific temperature values. FIG. 3A-3B, 4 and 5, described below, illustrate the logic configuration by which the PML of the memory controller receives input about the temperature conditions at the DIMMs and DRAMs and the select logic utilizes these conditions to select which reads and writes to issue. Notably, the overall selection process of the above-referenced related patent applications are affected by restrictions placed on issuing reads and writes from the read and write queues targeting specific ones of the DIMMs or specific DRAMs which are currently operating at or above the threshold power usage.

Figure 3A:
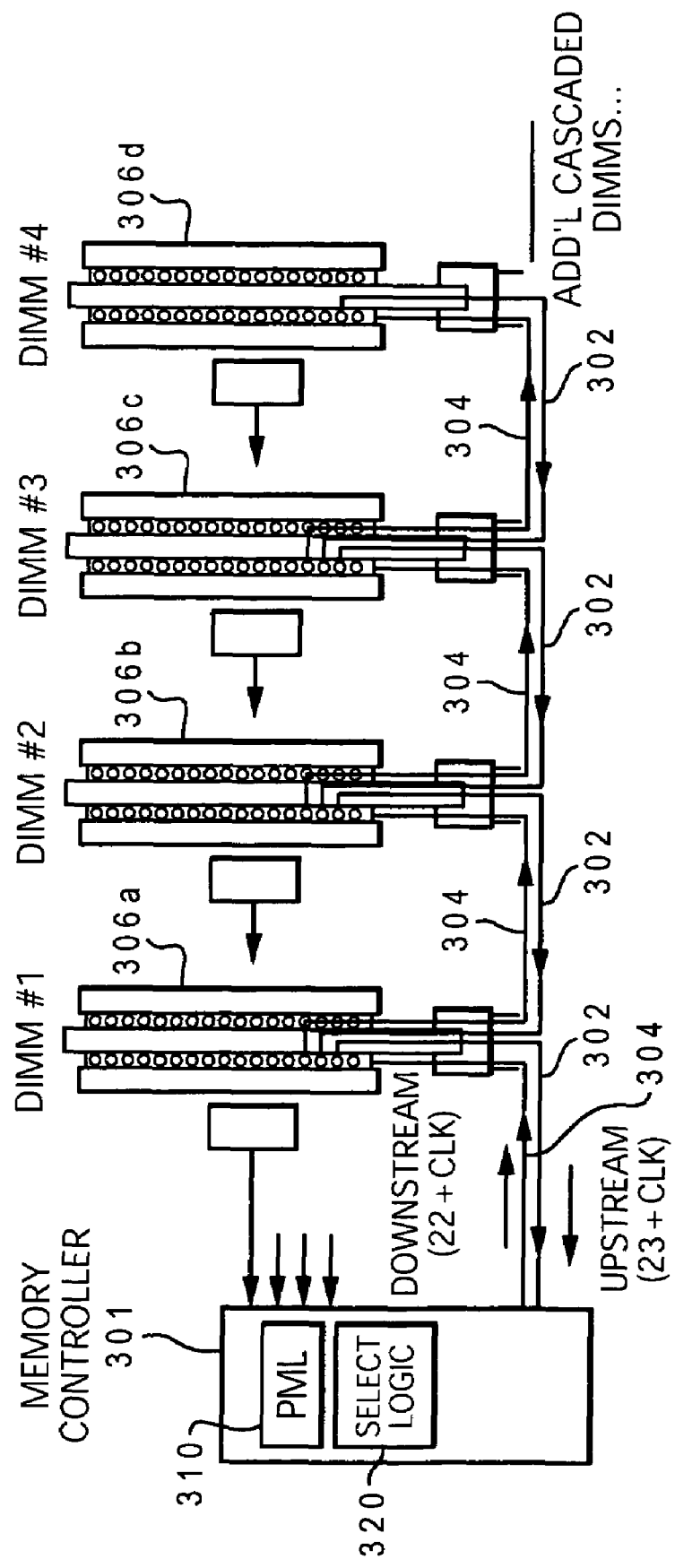
FIGS. 3A and 3B depict two views of the cascaded memory subsystem with DIMM-level power usage sensors providing feedback to the memory controller in accordance with one embodiment of the present invention.
Figure 3B:
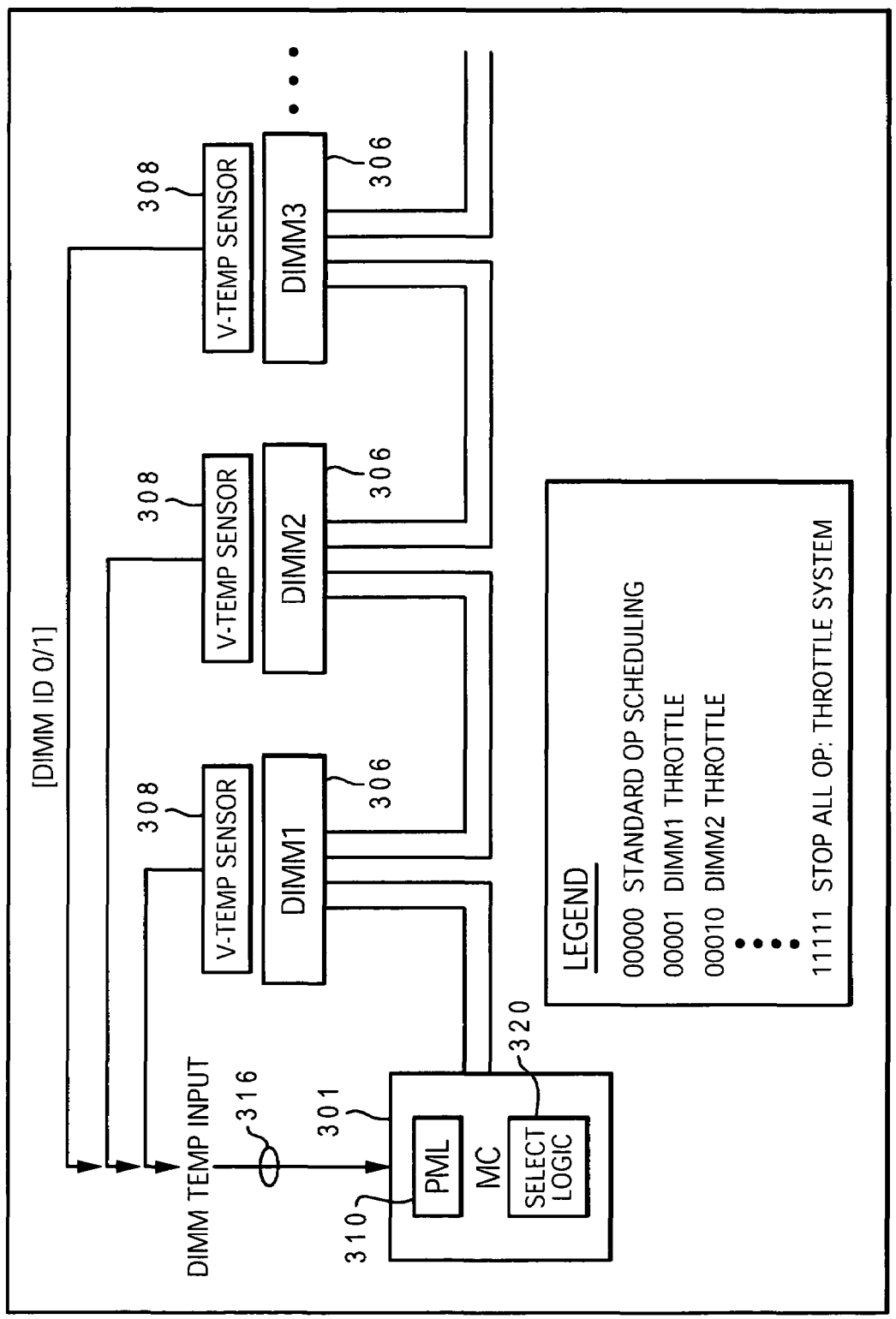

With reference now to FIGS. 3A-3B, there are illustrated two views of a memory subsystem with DIMM-level power usage sensors utilized to provide DIM-level power (temperature or voltage) management and response/control, according to one embodiment of the invention. A general description of the figures is now provided.

FIG. 3A includes the memory controller 301 and four memory modules 306a, 306b, 306c and 306d on each of two memory busses, a downstream memory bus (address/command/control bus) 304 and an upstream memory bus (system data bus) 302, connected to the memory controller 301 in either a direct or cascaded manner. Memory module 306a is connected to the memory controller 301 in a direct manner. Memory modules 306b, 306c and 306d are connected to the memory controller 301 in a cascaded manner.

The memory controller 301 interfaces to the memory modules 306 via a pair of high speed busses (or channels). An exemplary embodiment of the present invention includes two unidirectional busses between the memory controller 301 and memory module 306a ("DIMM #1"), as well as between each successive memory module 306b-d ("DIMM #2", "DIMM #3" and "DIMM #4") in the cascaded memory structure. The downstream memory bus 304 (outbound from the memory controller 301) interface has twenty-four pins and the upstream memory bus 302 (inbound to the memory controller 301) interface has twenty-five pins.

FIG. 3A-3B also depicts two views of the memory subsystem configured with individual power usage sensors associated with each DIMM, rather than a general system-level temperature/voltage sensor. Also illustrated within the memory subsystem is the enhanced power consumption feedback control, which includes multiple power usage sensors 308 providing power usage feedback to memory controller 301. With individual power usage sensors 308 allocated to each DIMM 306, and each power usage sensor providing a separate, per-DIMM, power usage input 316 to memory controller 301, memory controller logic is able to respond to each current DIMM condition individually, as described below.

Figure 4:
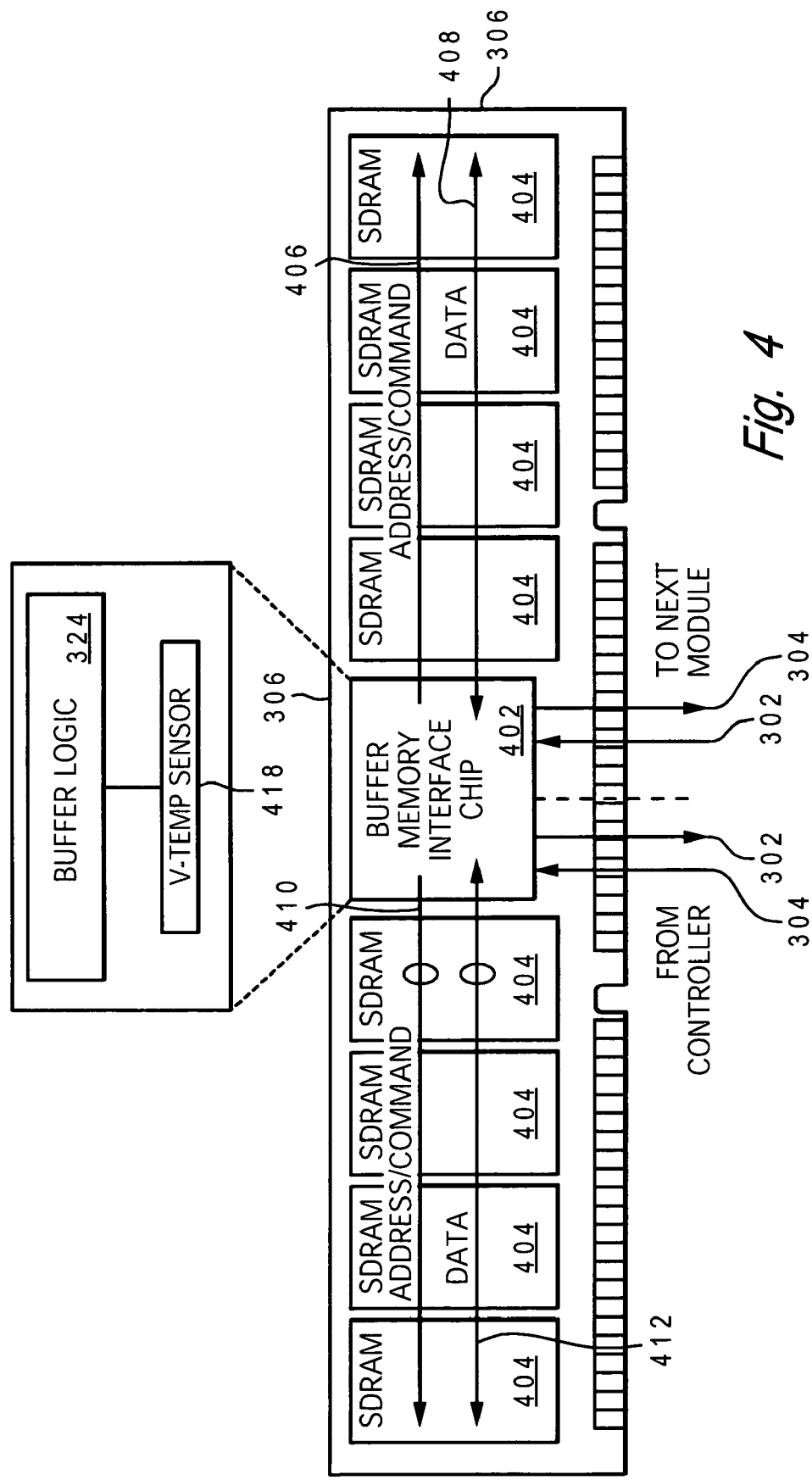
FIG. 4 depicts a buffered memory module with on-module power usage sensor according to one embodiment of the present invention.

Different methods of providing the individual DIMM power usage values are possible. FIG. 4 is a pictorial representation of an on-module (DIMM-level) power usage sensor provided on a memory module. The primary signal flows are represented by shaded arrows and include the upstream memory bus 302, the downstream memory bus 304, memory device address and command busses 410 and 406, and memory device data busses 412 and 408.

The high speed upstream memory bus 302 and downstream memory bus 304 exit from the lower portion of the buffer device 402, and connect to a memory controller or other memory modules either upstream or downstream of this memory module 306, depending on the application. One of these signals that are sent back to the memory controller is power usage alert signal obtained from power usage sensor 418 whenever the DIMM is at or above the threshold power usage (temperature) value ($T_{th}$) or below the threshold power usage (voltage) value ($V_{th}$), indicating too much current being consumed at the device. When this alert signal is received at the memory controller, the memory controller responds by throttling the issuance of new operations to that memory module.

In a related embodiment, the per-DIMM command throttling is coupled with feedback on temperature conditions on the DIMM and/or with feedback from the power delivery subsystem. With these additional inputs, the throttling is dynamically adjusted to maintain the desired conditions in spite of varying workloads, ambient temperatures, fan failures, etc.

The invention manages the access patterns to the individual DIMMs so that the power consumption at an individual DIMM stays within the cooling capability of the system. Completing power management at the DIMM level allows for higher available bandwidth at the memory controller level. A major benefit of this implementation is that it allows continued accesses to some DIMMs even if other DIMMs are currently maxed out on their cooling capability.

(3) Management of the Individual DRAM Power

In addition to the DIMM-level power usage management and control functions, management of the individual DRAM power is also provided to control the power usage of the individual DRAMs in the various DIMMS within the memory subsystem. The number of active ranks within a single DRAM are managed to limit the power dissipation within the DRAM itself. This function is valuable for those DIMMs with multiple ranks where the cooling capability of the DIMM is higher then the cooling capability at a DRAM level. For example, if all the accesses are to the same rank on a DIMM, some of the DRAMs on the DIMM may violate the DRAM specification and overheat while other DRAMS on the same DIMM remain cool.

Figure 5:
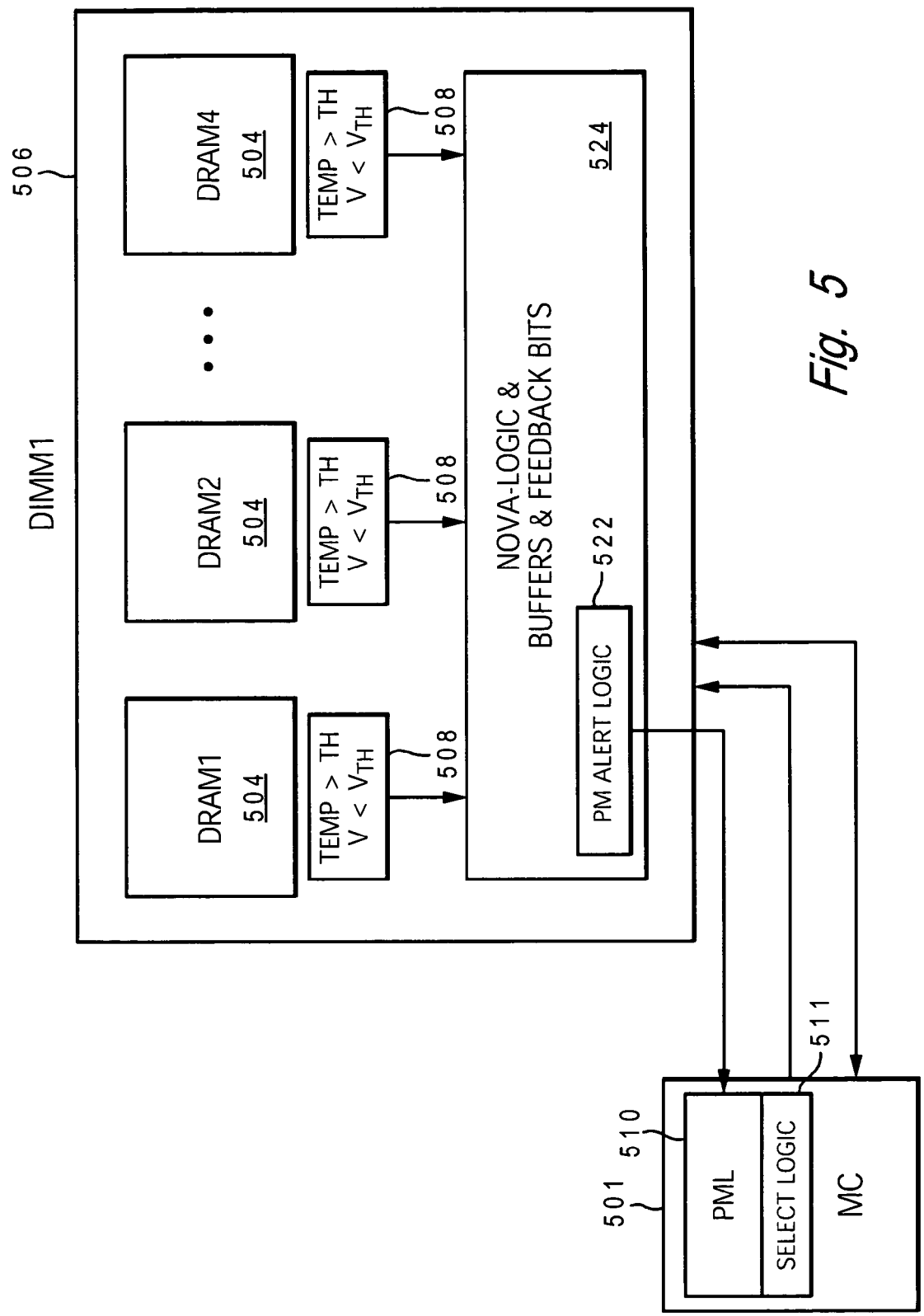
FIG. 5 depicts a memory subsystem configured for DRAM-specific power usage management and control according to one embodiment of the invention.

FIG. 5 illustrates an exemplary memory subsystem with DRAM-level sensors for DRAM-specific throttling, as needed. As shown, DIMM 506 comprises multiple DRAMs 504 and buffer logic 524. Buffer logic 524 includes a power usage alert/response logic (or PM alert logic) 522, which responds to power usage conditions (temperature and/or voltage) on each DRAM 504. The DRAM power usage conditions is recorded by power usage sensors 508, which provide a single bit input (1/0) to temperature alert/response logic 522 indicating whether the DRAM's power usage is within or below the normal limits (bit=0) or outside of (above) the normal limits (bit=1) for power usage at the DRAM.

In one embodiment, the memory controller actively manages the power down state of the DRAMs that are not in use to reduce the idle current. The present invention, however, targets the power consumption of the DRAM devices on the DIMMs which are the main consumer of power.

The power usage values may be provided via any one of the above described configurations of sensors based on the specific granularity of response desired within the system. With these temperature values received, the memory controller logic 511 dynamically determines which DIMM or DRAM is actually at or approaching the threshold and automatically implements throttling of the issuance of reads/writes to that particular DIMM via select logic 510.

Figure 6:
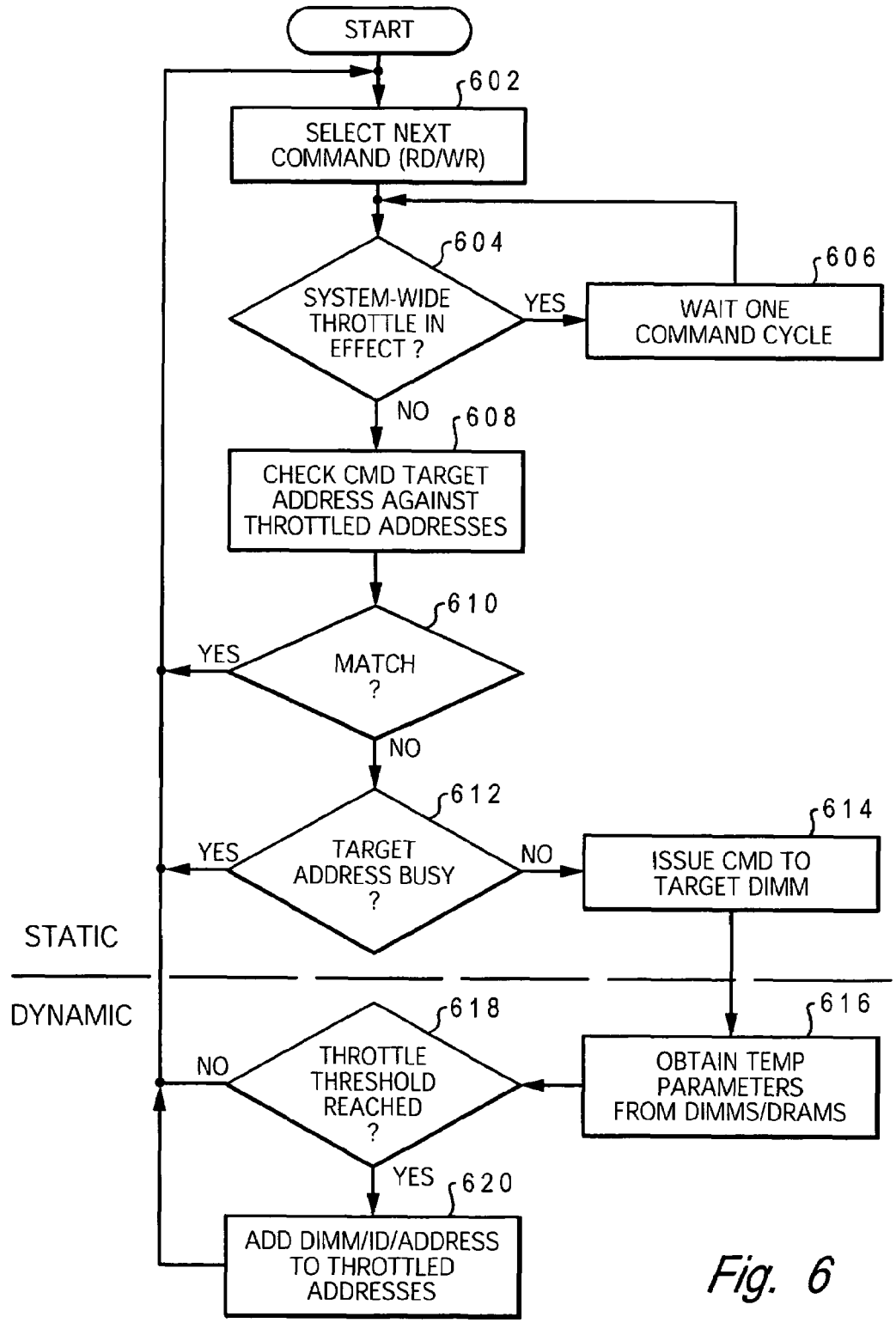
FIG. 6 is a flow chart depicting the process of scaling back commands to respond to operating parameters at the DIMMs for static and dynamic applications in accordance with an exemplary embodiment of the present invention.

FIG. 6 is a flow chart that generally illustrates the process by which the memory controller provides power management at the system-level, DIMM-level, and DRAM-level by throttling issuance of commands to specific memory devices. The processes of the flow chart above the dashed line represent the static model, while those processes below the dashed line expand the static model to include the features of the dynamic model.

The process begins at block 601 and proceeds to block 602 at which a new read/write command is selected by the memory controller's selection logic. At block 604, the selection logic checks the power management logic to determine whether a system-wide throttling is in effect (i.e., the entire memory subsystem is close to or at a maximum power-usage threshold. If a system-wide throttling is in effect, the select logic waits one command cycle before initiating another check of the PML, as shown at block 606. This check of the PML and subsequent wait of a command cycle continues in an iterative manner until the condition causing the system-wide throttling is not longer present.

Once there is no system-wide throttling in effect, the selection logic retrieves the target address of the command at block 608 and checks at block 610 whether the address is within the address space of a DIMM (or DRAM) that has been tagged for throttling (i.e., DIMM is at or above power usage threshold). If the command targets a DIMM that has been tagged for throttling, the controller logic returns to select a next command. If, however, the targeted DIMM is not tagged for throttling, the selection logic completes a second check, at block 612, of whether the targeted DIMM is busy. Determination of when a targeted DIMM is busy and whether to issue a next command to that target DIMM is described in details in co-pending patent applications AUS920041028 and AUS920041030, previously incorporated herein by reference. Notably, the check of whether the DIMM is busy may occur before or concurrently with the check of whether the DIMM has a throttle condition in place.

When the targeted DIMM is not busy, the selection logic issues the command to the target DIMM, as indicated at block 614. Then, the temperature parameters for the DIMMs are updated within the PML at block 616. At this point the static model returns to the beginning of the process, and the dynamic model proceeds to the next block. In the dynamic model, a check is made at block 618 whether the power usage threshold is reached by any one of the DIMMs, and if so, the specific DIMM is added to the list of DIMMs that is to be throttled, as shown at block 620.

Notably, in the static model, the power management logic completes the determination of when the particular DIMM is at the threshold value by monitoring the number of commands issued to the DIMM and the current state of the DIMM read and/or write buffers, etc. This information is compared with the pre-programmed temperature/power parameter of the DIMM after each command cycle or after each change in the current state of the DIMM (i.e., new command issued, data returned from buffers, data being returned from DRAM, etc., background write to buffers being completed, actual write of data to DRAMs in process, multiple writes to single DRAM, etc.).

(4) Management of the Address Space

Finally, to maintain the distribution of power across the DIMMs in the system, the address space is divided across all the individual DIMMS within the system. For example, in a conventional system with 4 DIMMs that are each 1 GByte in size, the address space is generally set with the first 1 GByte contained in the first DIMM, the $2^{nd}$ GByte in the second DIMM, etc. This allocation may cause hot spots on the DIMMs whenever an individual application is running with all of its requests being sent to the same DIMM. To avoid this problem, the address is split on a smaller granularity across the DIMMs, and the access pattern for requests to the DIMMs by a program is evenly distributed among all of the DIMMs in the system.

Thus, rather than provide sequential groupings of consecutive addresses in each individual DIMM, each sequence of addressed is shared across multiple DIMMs so that access to a sequence of addresses hit multiple DIMMs in sequence rather than a single DIMM. For example, addresses 0, 4, 8, 12, etc. may be in the first DIMM with 1, 5, 9, 13, etc. in the second DIMM and so forth. This configuration of the address space also allows DIMMs to be busy less frequently when a next access operation is received since the next operation does not target the same DIMM as the previous memory access operation. Table A below illustrates this address allocation for the first 64 addresses across 4 DIMMs.

| A | D | D | R | E | S | S | | A | L | L | O | C | A | T | I | O | N | | |
|---|---|---|---|---|---|---|---|---|---|---|---|---|---|---|---|---|---|---|---|
| D | 0 | 4 | 8 | 12 | D | 1 | 5 | 9 | 13 | D | 2 | 6 | 10 | 14 | D | 3 | 7 | 11 | 15 |
| I | 16 | 20 | 24 | 28 | I | 17 | 21 | 25 | 29 | I | 18 | 22 | 26 | 30 | I | 19 | 23 | 27 | 31 |
| M | 32 | 36 | 40 | 44 | M | 33 | 37 | 41 | 45 | M | 34 | 38 | 42 | 46 | M | 35 | 39 | 43 | 47 |
| M | 48 | 52 | 56 | 60 | M | 49 | 53 | 67 | 61 | M | 50 | 54 | 58 | 62 | M | 51 | 55 | 59 | 63 |

Those skilled in the art will appreciate that the granularity of address allocation does not have to be one address block in size to accomplish the above spacing among the DIMMs, so long as the allocation is sufficiently smaller then the DIMM size. With the above address allocation, the access pattern for requests to the DIMMs by a program is evenly distributed among all of the DIMMs in the system.

One benefit of the solution provided by the present invention is that the solution enables the memory subsystem to produce the maximum amount of bandwidth under the give cooling and packaging constraints of each given system. In order to provide this benefit while still implementing an effective power management scheme, recognition of both needs is required and a solution implemented that covers each inclusive of each other.

As described above, the embodiments of the invention may be embodied in the form of computer-implemented processes and apparatuses for practicing those processes. Embodiments of the invention may also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention.

The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. In a memory subsystem having a memory controller connected via a memory channel to multiple memory modules, a method comprising:

tracking each operation issued to the memory channel to determine an operational state of each memory module;

calculating a current power consumption of the memory subsystem utilizing each operational state along with one or more of a plurality of preset power usage parameters stored within the memory controller, said power usage parameters corresponding to (a) memory components within the memory subsystem and (b) the memory subsystem;

intelligently scheduling an issuing to the memory channel of new operations targeting one or more of the memory components to control a level of power consumption within the memory subsystem; and throttling the rate of issuing each of said new operations that target memory components whose current power consumption is above a preset threshold power consumption value for that memory component, wherein the rate at which new operations are sent to the memory component by the memory controller is reduced until the power consumption of memory component falls below the preset threshold power consumption value.

2. The method of claim 1, wherein said operational state is one of a power down state, a standby state, and an operating/processing state, each state having a different level of power consumption, said method further comprising:

determining a new operational state for a target memory component and the memory subsystem by:

adjusting the previous operational state within the memory controller as each new operation is issued to the memory channel, wherein the memory component targeted by the operation is identified within the memory controller as being in a processing state;

tracking a time required for each issued operation to be completed at the target memory component; and when the time expires, identifying the memory component as being in the standby state and re-adjusting the new operational state to account for the completion of the issued operation and subsequent return of the memory component to the standby state.

3. The method of claim 2, further comprising:

calculating the operational state of each individual memory component via the component's power parameters and the issued and completed operations targeting the memory device;

determining when the memory component is at or above a pre-established threshold maximum power consumption for that memory component;

throttling issuing new operations to that memory component to reduce a rate at which new operations are sent to the memory component by the memory controller until the memory component is no longer at or above the pre-established threshold maximum; and enabling other operations to be issued to other memory components that are not at or above their pre-established threshold maximum, wherein utilization of the memory channel bandwidth and data bus bandwidth of the memory components across the memory subsystem are substantially maximized without having any one memory component operate at above its maximum power consumption threshold.

4. The method of claim 1, wherein:

said preset power usage parameters include: (1) the power ratings of the memory subsystem and each individual memory component, including the power rating of each memory module when a module-level tracking is implemented and the power rating of each memory device when a device-level tracking is implemented; (2) the number and type of memory modules and the power consumption associated with each operational state of each memory module; (3) the number and types of memory storage devices within each memory module and the power consumption associated with each operational state of each memory storage device; and the calculated power consumption values include: (1) calculated current power consumption for the memory channel and memory controller; (2) calculated current power consumption at each memory module based on the number and frequency of issued operations to the specific memory module; (3) calculated current power consumption at each memory storage device within the memory module based on the number and frequency of issued operations addressed to the specific memory storage device.

5. The method of claim 1, wherein said controlling the level of power usage further comprises:

calculating an average usage of a preset period of time; and initiating said controlling of the level of power usage on a time average basis, wherein the issuing of operations is not throttled until the power usage over the preset period of time exceeds a pre-established average power usage.

6. The method of claim 1, wherein said controlling the level of power usage comprises:

implementing one or more of a plurality of memory subsystem management functions including: (1) managing a total power consumption of the memory subsystem; (2) managing a power consumption for each memory module; and (3) managing a power consumption for each memory device within each memory module; and allocating sequential memory addresses across multiple memory modules in a granularity that allows access to consecutive memory addresses to hit different ones of the multiple memory modules, wherein access to a sequence of sequential addresses are routed via the memory channel to different ones of the multiple memory modules such that no single memory module receives a large number of sequential address operations and wherein power consumption during the access by the sequence of sequential addresses is spread among the multiple memory modules.

* * * * *